(12) United States Patent
Merrill et al.

(10) Patent No.: US 6,211,510 B1
(45) Date of Patent: *Apr. 3, 2001

(54) ACTIVE PIXEL SENSOR WITH BOOTSTRAP AMPLIFICATION

(75) Inventors: Richard B. Merrill, Woodside; Richard F. Lyon, Los Altos, both of CA (US)

(73) Assignee: Foveon, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/491,462

(22) Filed: Jan. 26, 2000

Related U.S. Application Data

(63) Continuation of application No. 09/099,116, filed on Jun. 17, 1998.

(51) Int. Cl.⁷ .................................................. H04N 3/14
(52) U.S. Cl. .................................. 250/208.1; 348/302
(58) Field of Search .................. 250/208.1, 214.1; 348/294, 300–302, 308, 311; 327/514

(56) References Cited

U.S. PATENT DOCUMENTS

| | | | |
|---|---|---|---|
| 3,866,067 | * 2/1975 | Amelio | 327/514 |
| 4,395,736 | * 7/1983 | Fraleax | 250/214.1 |
| 5,335,015 | * 8/1994 | Cooper et al. | 348/302 |
| 5,471,245 | * 11/1995 | Cooper et al. | 348/302 |

* cited by examiner

*Primary Examiner*—Stephone B. Allen
(74) *Attorney, Agent, or Firm*—Sierra Patent Group, Ltd.

(57) ABSTRACT

In a first embodiment an active pixel sensor includes a photodiode for capturing photocharge, a reset transistor for resetting the photodiode to a reset potential, and a readout transistor, and in a second embodiment an active pixel sensor includes a photodiode for capturing photocharge, a reset transistor for resetting the photodiode to a reset potential, a transfer transistor for transferring captured photocharge, and a readout transistor. In both embodiments, the readout transistor has a drain that is coupled to a first supply voltage during integration of photocharge and a second supply voltage during readout of the photocharge. Accordingly, the sensitivity of an active pixel sensor is increased by increasing the fill factor, the noise an active pixel sensor is reduced by increasing the relative size of the readout transistor, and the gain is compressive as the relative light intensity in an active pixel sensor increases.

6 Claims, 6 Drawing Sheets

ACTIVE PIXEL SENSOR WITH BOOTSTRAP AMPLIFICATION

This application is a Continuation or 09/099,116, filed Jun. 17, 1998.

BACKGROUND OF THE INVENTION

1. Field Of The Invention

The present invention relates to active pixel sensors. More particularly, the present invention relates to variable biasing of the readout transistor in an active pixel sensor to improve sensitivity, reduce noise and to provide compressive non-linearity in the charge-to-voltage gain.

2. The Prior Art

In the art of CMOS active pixel sensors, the sensitivity, noise, and nature of the gain of an active pixel sensor present issues of concern. The sensitivity of an active pixel sensor in measuring the charge generated by the photons striking the active pixel sensor is typically characterized by determining the volts generated per photon of light striking the active pixel sensor and is termed charge-to-voltage gain. The readout amplifier in an active pixel sensor represents a substantial source of noise that in prior art pixel sensors has required design tradeoffs. The gain in prior art active pixel sensors is most often expansive, though it is preferred to be compressive.

The sensitivity of an active pixel sensor is determined by at least three factors. The first factor is related to the percentage of the area in the active pixel sensor available for converting photons to electrons. This is known as the fill factor. An increase in the area leads to an increase in the amount of charge generated. A second factor affecting the sensitivity of the active pixel sensor is related to the capacitance that is available for the integration of the charge sensed by the active pixel sensor. It will be appreciated that the voltage on the capacitor for given amount of charge is inversely proportional to the size of the capacitor. Accordingly, when the capacitance increases, the voltage decreases for the same amount of charge. A third factor is the gain of the readout amplifier for the active pixel sensor. Since the readout amplifier in the prior art is typically a transistor configured as a source follower, the gain is less than one.

One source of noise in an active pixel sensor is created by threshold fluctuations in the readout transistor. The amount of threshold fluctuation is related to the size of the readout transistor. As the size of the readout transistor is increased, the amount of threshold fluctuation, and hence the amount of noise decreases.

In compressive nonlinear gain, the gain at high light levels is less than the gain at low light levels. Those of ordinary skill in the art will appreciate that it is typically desirable to have greater sensitivity in converting photons-to-voltage at lower rather than higher light levels, because this increases the signal-to-noise ratio at lower light levels and, accordingly, the usable dynamic range of the active pixel sensor is increased.

The CMOS active pixel sensor art includes active pixel sensors that may or may not have embedded storage. FIGS. 1A and 2A illustrate typical CMOS active pixel sensors without and with embedded storage, respectively.

In an active pixel sensor 10 of FIG. 1A, a photodiode 12 employed to collect charge has an anode connected to a fixed voltage potential, shown as ground, and a cathode connected to the source of an N-channel MOS reset transistor 14 and the gate of an N-channel MOS readout transistor 16. The gate of N-channel MOS reset transistor 14 is connected to a RESET line, and the drain of N-channel MOS reset transistor 14 is connected to a voltage reference, Vref. The drain of N-channel MOS readout transistor 16 is connected to a fixed potential Vcc, and the drain of N-channel MOS readout transistor 16 is connected to an N-channel MOS row select transistor 18. Typically, the voltage Vref and the voltage Vcc are the same. In the active pixel sensor 10, the capacitance available for the integration of the charge sensed by the active pixel sensor includes the photodiode 12 capacitance and the gate capacitance of the N-channel MOS readout transistor 16.

The operation of the active pixel sensor 10 as it is typically performed is well understood by those of ordinary skill in the art. A timing diagram corresponding to the operation of active pixel sensor 10 is depicted FIG. 1B. The active pixel sensor 10 is first reset by a RESET signal, during a reset step, that turns on N-channel MOS reset transistor 14 to place the voltage Vref on the cathode of the photodiode 12. An integration step begins when the RESET signal makes a transition from HIGH to LOW wherein photo-generated electrons are collected on the photodiode 12 to reduce the voltage on the cathode of the photodiode 12 from the value Vref placed there during the reset step. During a readout step, a ROW SELECT signal will be asserted to turn on N-channel MOS select transistor 18 to place the voltage at the source of N-channel MOS readout transistor 16 on the column output line for detection. It should be appreciated that the voltage on the gate of N-channel MOS readout transistor 16 formed by the charge accumulated on the cathode of the photodiode 12 will be followed by the source of N-channel MOS readout transistor 16.

In FIG. 2A, the CMOS active pixel sensor 30 has embedded storage. The active pixel sensor 30 includes a photo-diode 32 having an anode that is connected to ground and a cathode that is connected to the source of N-channel MOS reset transistor 34. The gate of N-channel MOS reset transistor is connected to a RESET line, and the drain of N-channel MOS reset transistor 34 is connected to a voltage Vref. The cathode of photodiode 32 is also connected to the source of N-channel MOS transfer transistor 36. The gate of N-channel MOS transfer transistor 36 is connected to a XFR line, and the drain of N-channel MOS transfer transistor 36 is connected to a first plate of a capacitor 38 and to the gate of N-channel MOS readout transistor 40. The drain of N-channel MOS readout transistor 40 is connected to Vcc, and the source of N-channel MOS readout transistor 40 is connected to N-channel MOS select transistor 42. Typically, the voltage Vref and the voltage Vcc are equal to one another.

In the active pixel sensor 30, the capacitance available for the integration of the charge sensed by the active pixel sensor 30 includes the capacitance of a photodiode 32, the capacitance of the storage capacitor 38, and the gate capacitance of the N-Channel MOS readout transistor 40. It should be appreciated, however, that because the voltage at the drain of the N-channel MOS readout transistor 40 is high, the capacitance at the gate of the N-channel MOS readout transistor 40 is small and the gate capacitance of the N-channel MOS readout transistor 40 is not typically a preferred charge storage element.

A timing diagram corresponding to the operation of active pixel sensor 30 is depicted FIG. 2B. In the operation of the active pixel sensor 30, with the N-channel MOS transistor 34 turned on by a RESET signal to place the voltage Vref at the cathode of the photodiode 32, the N-channel MOS transfer transistor is also turned on by a signal asserted on the XFR line. When the N-channel MOS reset transistor 34 is turned off, the integration of photons striking the photodiode 32 begins. Since the N-channel MOS transfer transistor 36 is turned on, the capacitor 38 adds to the capacitance of the photodiode 32 during integration to increase the charge capacity and therefore, the intensity range of the storage pixel sensor 30. At the end of the integration period, the N-channel MOS transfer transistor 36 is turned off and the N-channel MOS row select transistor 42 is subsequently turned on so that the voltage at the gate of the N-channel MOS readout transistor 40 will be followed by the source of N-channel MOS readout transistor 40 to be placed on the column output.

In both active pixel sensors 10 and 30, by minimizing the gate area of the N-channel MOS readout transistors 16 and 40, respectively, the area provided to the photodiodes 12 and 32, respectively, can be made larger to improve the sensitivity by increasing the fill factor, and reducing the area for capacitance. Unfortunately, in reducing the gate capacitance of the N-channel MOS readout transistors 16 and 40, the noise in the N-channel MOS readout transistors 18 and 40 increases by an amount that is roughly in an inverse proportion to the gate areas of the N-channel MOS readout transistors 16 and 40. As such, when the gate area of the N-channel MOS readout transistors 16 and 40 is made smaller, the noise increases, and when the gate area of the N-channel MOS readout transistors 16 and 40 is made larger, the noise decreases.

In the case of the active pixel sensor 30, wherein the storage element 38 is included as a separate element, the sensitivity and noise issues are made more acute. The sensitivity is reduced because storage element 38 further reduces the fill factor, and the noise is increased because it reduces the available space for the N-channel MOS readout transistor 40.

Accordingly, it is an object of the present invention to increase the sensitivity of an active pixel sensor.

It is a further object of the present invention to decease the noise of an active pixel sensor.

It is yet another object of the present invention to compress the gain in an active pixel sensor as the relative light intensity increases.

BRIEF DESCRIPTION OF THE INVENTION

According to the present invention, the sensitivity of an active pixel sensor is increased by increasing the fill factor, the noise of an active pixel sensor is reduced by increasing the relative size of the readout transistor, and the gain is compressive as the relative light intensity in an active pixel sensor increases.

In a first embodiment, an active pixel sensor includes a photodiode, a reset transistor, and a readout transistor. The photodiode has an anode and a cathode, wherein the anode is connected to a first reference potential. The reset transistor has a gate, a source and a drain, wherein the gate is connected to a reset line, the drain is connected to a second reference potential greater than the first reference potential, and the source is connected to the cathode of the photodiode. The readout transistor has a gate, a source, and a drain, wherein the gate is connected to the cathode of the photodiode, and the drain is connected to a switchable supply voltage.

In a second embodiment, an active pixel sensor includes a photodiode, a reset transistor, a transfer transistor, and a readout transistor. The photodiode has an anode and a cathode, wherein the anode is connected to a first reference potential. The reset transistor has a gate, a source and a drain, wherein the gate is connected to a reset line, the drain is connected to a second reference potential greater than the first reference potential, and the source is connected to the cathode of the photodiode. The transfer transistor has a gate, a first drain/source, and a second drain/source, wherein the gate is connected to a transfer line and the first drain/source is connected to the cathode of the photodiode. The readout transistor has a gate, a source, and a drain, wherein the gate is connected to the second drain/source of the transfer transistor, and the drain is connected to a switchable supply voltage.

In a method according to the present invention, the voltage at the drain of the readout transistor of an active pixel sensor is held at a low level during the integration period of the active pixel sensor, and is brought to a high level or pulsed to a high level in synchronism with the row select signals during the readout period.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1A:
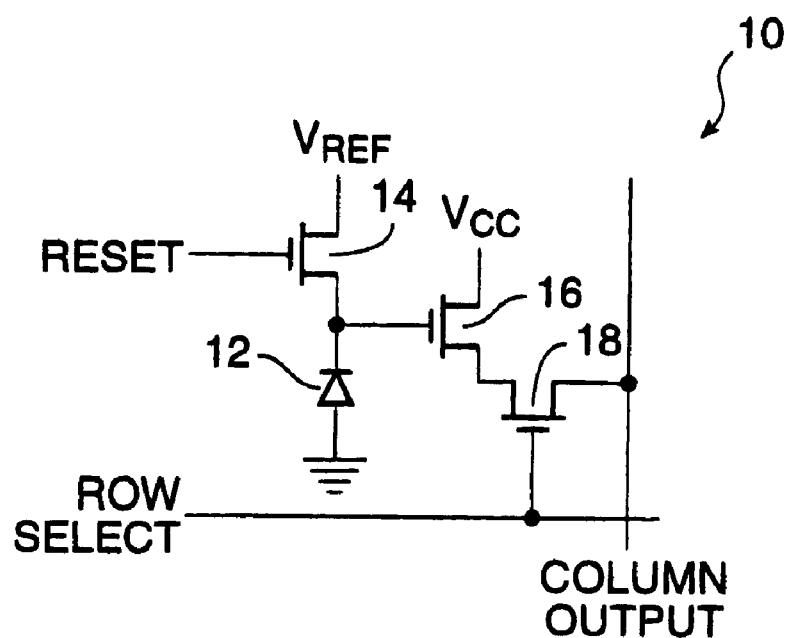
FIG. 1A illustrates a simplified schematic of a first known active pixel sensor.
Figure 1B:
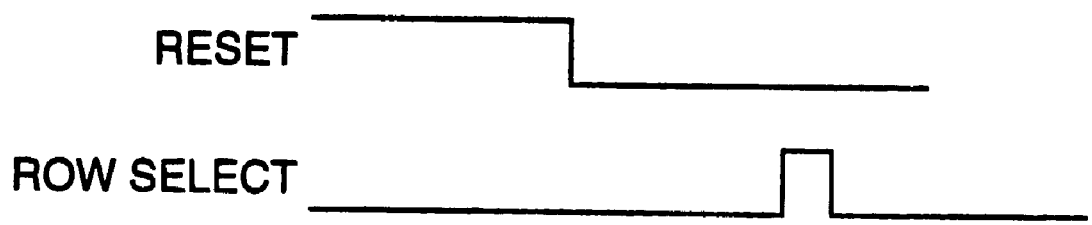
FIG. 1B is a timing diagram corresponding to the operation of the active pixel sensor depicted in FIG. 1A.
Figure 3A:
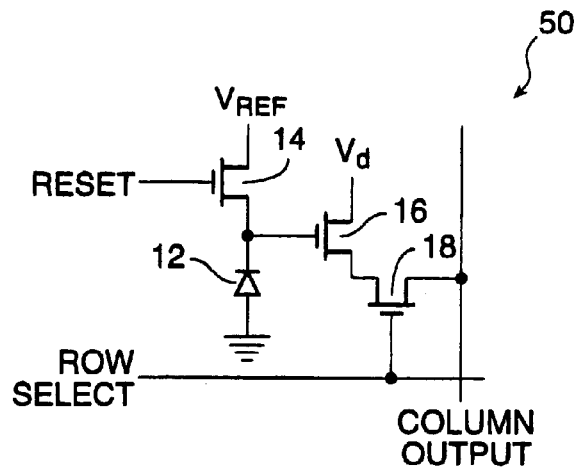
FIG. 3A illustrates a simplified schematic of a first embodiment of an active pixel sensor according to the present invention.
Figure 4A:
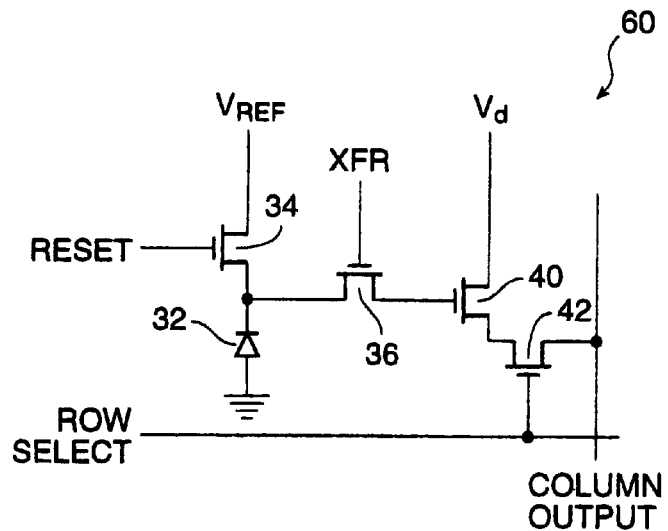
FIG. 4A illustrates a simplified schematic of a second embodiment of an active pixel sensor according to the present invention.

In FIGS. 3A and 4A, first and second embodiments of active pixel sensors 50 and 60, respectively, according to the present invention are depicted. The active pixel sensor 50 in FIG. 3A is similar to the active pixel sensor 10 of FIG. 1A, and accordingly, the same reference numerals are employed.

Active pixel sensor 50 differs from active pixel sensor 10 in the important aspect that the drain of the N-channel MOS readout transistor 18 is connected to a switchable supply voltage Vd.

Figure 3B:
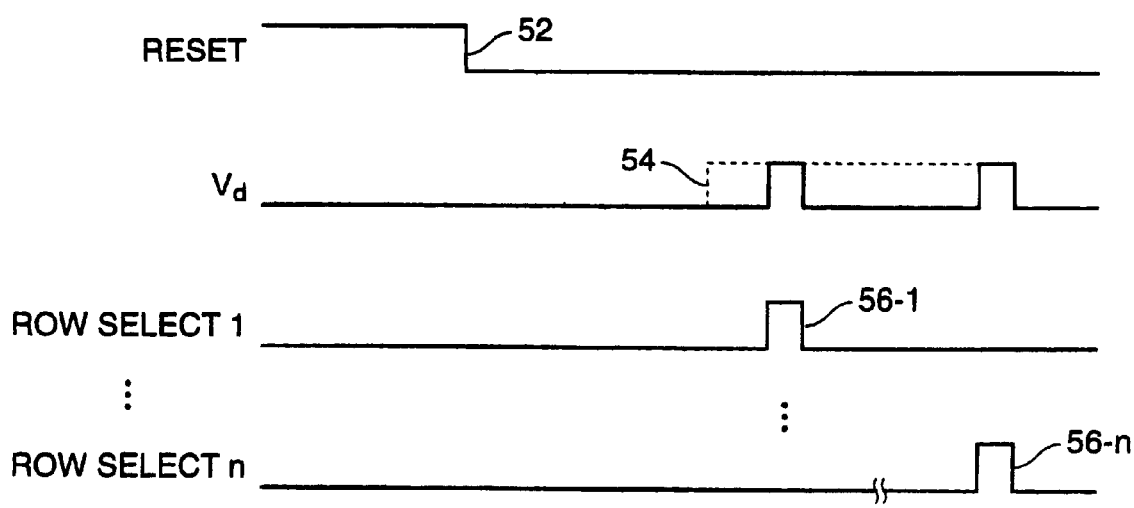
FIG. 3B is a timing diagram corresponding to the operation of the active pixel sensor depicted in FIG. 3A.

A timing diagram corresponding to the operation of active pixel sensor 50 is depicted FIG. 3B. In the operation of active pixel sensor 50, the RESET signal is first at a HIGH level to turn on the N-channel MOS reset transistor 14 and thereby set the cathode of photodiode 12 at Vref. When the RESET signal makes a transition from HIGH to LOW at falling edge 52, the integration of photocharge as described above begins. During a readout step, in contrast to the prior art, the supply voltage Vd at the drain of the N-channel MOS readout transistor 16 is switched to make a transition from LOW to HIGH. According to the present invention, the supply voltage Vd may either be brought HIGH during the entire readout, as illustrated by dashed line 54 or it may be brought HIGH when each of the ROW SELECT signals 56-1 through 56-n is asserted. It should be appreciated that the ROW SELECT 1 through n lines are connected to rows of the active pixel sensors 50 in a manner understood by those of ordinary skill in the art When the ROW SELECT signals 56-1 through 56-n are asserted the images stored in the respective active pixel sensors 50 for each of the rows will be read out in a manner similar to that described above.

Figure 2A:
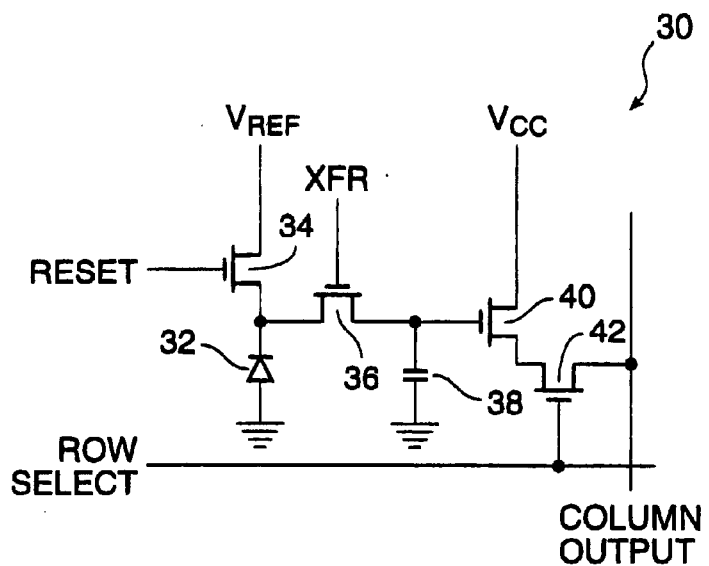
FIG. 2A illustrates a simplified schematic of a second known active pixel sensor.
Figure 2B:
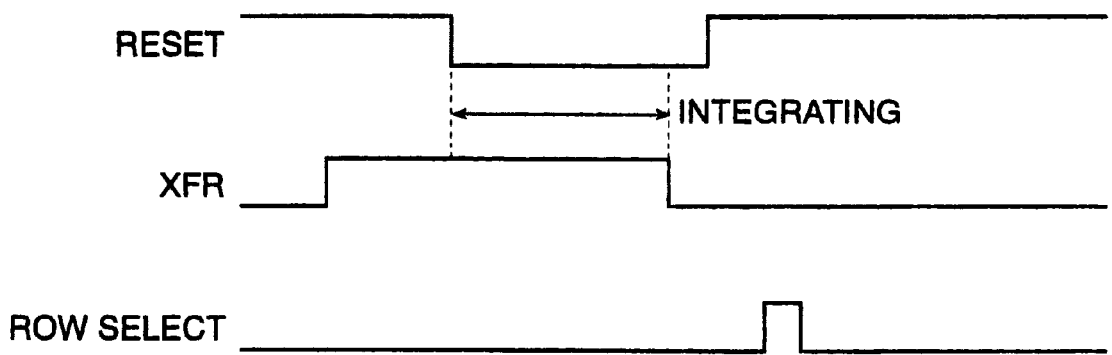
FIG. 2B is a timing diagram corresponding to the operation of the active pixel sensor depicted in FIG. 2A.

The active pixel sensor 60 depicted in FIG. 4A according to the present invention is similar to the active pixel sensor 30 in FIG. 2A. Accordingly, the same reference numerals employed in FIG. 2A are also employed in FIG. 4A. The active pixel sensor 60, according to the present invention, differs from the active pixel sensor 30 in two important aspects. First, the separate storage capacitor 38 present in the active pixel sensor 30 is not needed in the active pixel sensor 60, and the drain of N-channel MOS readout transistor 38 is connected to a switchable supply voltage Vd. Further, the voltage Vref is a lower voltage than that found in the prior art.

Figure 4B:
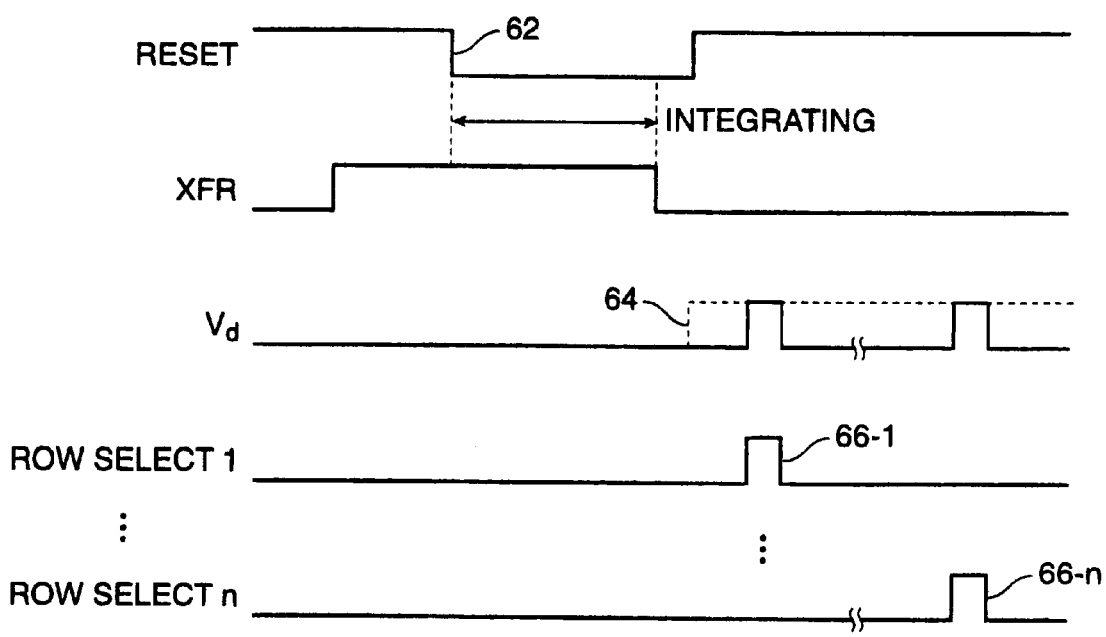
FIG. 4B is a timing diagram corresponding to the operation of the active pixel sensor depicted in FIG. 4A.

A timing diagram corresponding to the operation of active pixel sensor 60 is depicted in FIG. 4B. In the operation of the active pixel sensor 60, with the N-channel MOS transistor 34 turned on by a HIGH RESET signal to place the voltage Vref at the cathode of the photodiode 32, the N-channel MOS transfer transistor is also turned on by a HIGH signal asserted on the XFR line. When the N-channel MOS reset transistor 34 is turned off by the RESET signal making a transition 62 from HIGH to LOW, the integration of photons striking the photodiode 32 begins. To end the integration period, the N-channel MOS transfer transistor 36 is turned off. According to the present invention, during a readout period the supply voltage Vd may either be brought HIGH during the entire readout, as illustrated by dashed line 64 or it may be brought HIGH when each of the ROW SELECT signals 66-1 through 66-n is asserted. When the ROW SELECT signals 66-1 through 66-n are asserted the images stored in the respective active pixel sensors 60 for each of the rows will be read out.

In the operation of the storage pixels 50 and 60 according to the present invention as described, there is a reset period, an integration period, and a read out period. However, unlike the operation of prior art active pixel sensors, the, drain of the N-channel MOS readout transistors 16 and 40, respectively, is set to a first voltage level, preferably near ground, during the integration period, and then set to a second voltage level, preferably greater than Vref, during the readout period. Pursuant to these biasing conditions, the gates of the N-channel MOS readout transistors 16 and 40 in active pixel sensors 50 and 60, respectively, operate as large nonlinear capacitors during the charge integration period, and as small and nearly linear capacitors during the readout period.

When the sources of the N-channel MOS readout transistors 16 and 40, respectively, are set near ground, the N-channel MOS readout transistors 16 and 40 will be turned on. As such, the gates of N-channel MOS read out transistors 16 and 40 provide a large capacitance. During integration, the large on-state capacitance at the gates of N-channel MOS readout transistors 16 and 40 is connected in parallel with, and therefore adds to, the capacitance of the photodiodes 12 and 32, respectively. This increased capacitance decreases the charge-to-voltage gain during the integration period.

However, when the drains of N-channel MOS readout transistors 16 and 40 are brought high during the readout period, the change in the variable supply voltage Vd boosts the voltage on the gate via a "bootstrap" capacitive coupling effect well known to those of ordinary skill in the art, and the decrease in the charge-to-voltage gain realized during the integration period described above will typically be compensated for by the increased readout gain that comes from the bootstrapping dynamics when the drains of N-channel MOS readout transistors 16 and 40 are brought high. This bootstrap effect provides a large operating range of the output signal voltages. Accordingly, this biasing scheme according to the present invention increases the sensitivity of the active pixel sensors.

Since the gate of Nehannel MOS readout transistor 40 is boosted to a higher level during readout, a voltage Vref that is lower than that found in the prior art is preferred. As a consequence, the logic high voltage level on the RESET signal line may also be reduced.

In contrast to the prior art, because the storage element 38 shown in FIG. 2A has been eliminated from the active pixel sensor 60 as depicted in FIG. 4A, the sensitivity of the active pixel sensor 60 may be increased by enlarging the area available to the photodiode 32 without a loss of the photocharge generated due to the large on-state capacitance of the gate of N-channel MOS readout transistor 40.

Since raising the variable supply voltage Vd to the drains of N-channel MOS transistors 16 and 40 and letting the source terminals settle upward causes the gate capacitance of N-channel MOS readout transistors 16 and 40 to change from a high capacitance to a low capacitance, it will be appreciated that there will be a corresponding redistribution of charge and voltage values within the active pixel sensors 50 and 60.

During the readout period of active pixel sensor 50, the photo-generated charge can no longer be held on the gate of N-channel MOS readout transistor 16, so it is held instead on the capacitance of photodiode 12. Since the net capacitance is lower, the charge-to-voltage gain is higher. The bootstrapping action can be viewed as reducing the capacitance to get a higher voltage signal on the photodiode 12, and then reading out that signal according to the gain of N-channel MOS readout transistor 16 operating as a source follower.

During the readout period of active pixel sensor 60, the effect of the bootstrap action is both beneficial and surprising. After accumulating charge during the integration period, the N-channel MOS transfer transistor 36 is turned off by the control signal on the XFR line. When the gate capacitance of N-channel MOS readout transistor 40 becomes small during readout, the area to which the photo-generated charge may be redistributed is small. That is, the associated stray capacitance of the circuit node that includes the source/drain terminal of N-channel MOS transfer transistor 36 and the gate terminal of N-channel MOS readout transistor 40 is quite small, compared to the photodiode 12 capacitance. This greatly reduced capacitance leads to an increased charge-to-voltage gain.

The limit on the achievable charge-to-voltage gain is determined by the linear combination of the voltage at the gate of N-channel MOS readout transistor 40, and the back-gate or substrate voltage of the N-channel MOS readout transistor 40 that is needed to place the N-channel MOS readout transistor 40 at threshold. The resulting conversion is a nearly linear function of the charge signal that was captured on the storage node at the gate of N-channel MOS readout transistor 40.

It should be appreciated that when the column output and the sources of the N-channel MOS read out transistors 18 and 40 settle, the N-channel MOS read out transistors 18 and 40 will be near threshold. The voltage at the source, taking into account the body effect, κ, is expressed by the following relation:

$$V_S = \kappa(V_G V_{Th})$$

Accordingly, the two unknowns, the source and the gate voltages of N-channel MOS readout transistors 16 and 40 are linearly related.

The expression of charge conservation at the gate of the N-channel MOS readout transistors 16 and 40 which provides a further constraint is as follows:

$$(\Delta V_S - V_G)C_{GS} + (\Delta V_D - V_G)C_{GD} = V_G C_S$$

In this expression, assuming linear capacitances, the gate capacitance of N-channel MOS readout transistors 16 and 40 couple primarily to the sources when the drains of N-channel MOS readout transistors 16 and 40 are brought high so that the gate to source capacitance $C_{GS}$ dominates the gate to drain capacitance $C_{GD}$. The stray storage node capacitance is represented by $C_S$. Though this capacitance may be relevant, it may be small in the active pixel 60.

Defining a gate voltage $V_{GO}$ before bringing $V_D$ high, and a final gate voltage $V_G$, such that $V_G = V_{GO} + \Delta V_G$, and assuming $V_D$ and $V_S$ are initially at ground so that $V_S = \Delta V_S$ and $V_D = \Delta V_D$, the bootstrapped gate voltage of N-channel MOS readout transistors 16 and 40 may be expressed as:

$$V_G = \frac{V_{GO}(C_{GD} + C_{GS} + C_S) + V_D C_{GD} - \kappa V_{Th} C_{GS}}{C_{GD} + (1-\kappa)C_{GS} + C_S}$$

As a result, the column output voltage may be expressed as the source voltage as follows:

$$V_S = \kappa\left(\frac{V_{GO}(C_{GD} + C_{GS} + C_S) + \Delta V_D C_{GD} - \kappa V_{Th} C_{GS}}{C_{GD} + (1-\kappa)C_{GS} + C_S} - V_{Th}\right)$$

This implies that the gain from the signal initially stored at the gate of N-channel MOS readout transistors 16 and 40 to the column output during read out is expressed by the following relation:

$$dV_S/dV_{GO} = \frac{\kappa(C_{GD} + C_{GS} + C_S)}{C_{GD} + (1-\kappa)C_{GS} + C_S} \approx \frac{\kappa}{(1-\kappa)}$$

wherein the approximation holds for small values of $C_{GD}$ and $C_S$.

The linear conversion of captured charge to a final voltage on the column output line has two beneficial consequences. First, it means that a large capacitance value at the gate of N-channel MOS readout transistor 40 has a beneficial rather than a harmful, effect on the overall gain, since a larger capacitance on that side of the N-channel MOS transfer transistor 36 means that a larger fraction of the photocharge is captured, as opposed to being wasted charging the photodiode 32 itself. The overall gain will typically exceed even the gain of the photodiode 32 without any additional capacitive loading. Therefore, increasing the N-channel MOS readout transistor 40 size to reduce noise will not substantially reduce the gain.

Second, the linear conversion from captured charge to output voltage can lead to a beneficial compressive non-linearity as follows. As photocharge is accumulated, the gate of N-channel MOS readout transistor 40 will fall in voltage until at some point it falls below a threshold voltage, at which point the gate capacitance will change from high to low. Further photocharge will accumulate primarily on the photodiode 32 capacitance only, so the voltage at the gate of N-channel MOS readout transistor 40 will it fall more quickly. This charge-to-voltage break-point non-linearity during integration is expansive, not compressive, but nonetheless leads surprisingly to a compressive break-point non-linearity in the overall gain. When the N-channel MOS transfer transistor 36 is turned off, the proportion of charge stored on the storage side of the N-channel MOS transfer transistor 36 is reduced at high light levels, since more of that charge is kept on the photodiode 32 instead. Hence the integrated image signal voltage responds expansively during integration, yet a linear readout of the stored charge responds compressively.

Figure 5A:
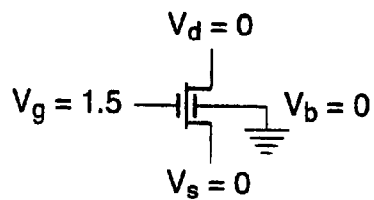
FIG. 5 illustrates the gate, drain, source, and back-gates voltages in a readout transistor during integration and readout in a first example according to the present invention.
Figure 5B:
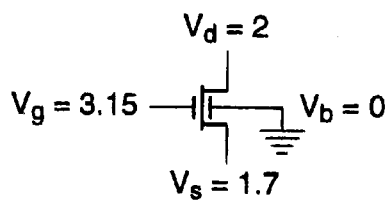
Figure 6A:
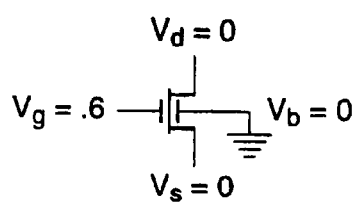
FIG. 6 illustrates the gate, drain, source, and back-gates voltages in a readout transistor during integration and readout in a second example according to the present invention.
Figure 6B:
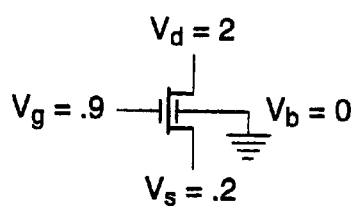
Figure 7A:
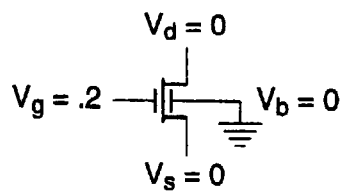
FIG. 7 illustrates the gate, drain, source, and back-gates voltages in a readout transistor during integration and readout in a third example according to the present invention.
Figure 7B:
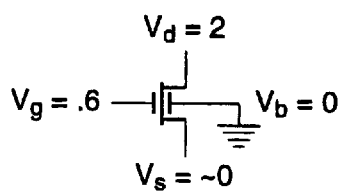

Turning now to FIGS. 5, 6, and 7 examples of the voltages found on N-channel MOS readout transistors 16 and 40 during the integration period and readout periods for different light intensities are illustrated. In FIGS. 5, 6, and 7, the voltages correspond to increasing intensity conditions, as the light goes from darker to a lighter.

As depicted in FIGS. 5, 6, and 7, during the integration period, the voltage at both the drain and the source of the readout transistor are both at ground, and by convention the substrate or back-gate potential is also referred to as ground. In FIGS. 5, 6, and 7, the voltages at the gate of the readout transistor at the end of the integration period are 1.5, 0.6, and 0.2 volts, respectively. Since, in this example, the Vref to which the photodiode is initially set is 1.5 volts, the 1.5 volts at the gate of the readout transistor in FIG. 5 corresponds to a dark condition, and the 0.2 volts at the gate of the readout transistor in FIG. 7 corresponds to a lighter condition than the 0.6 volts at the gate of the readout transistor in FIG. 6.

During the readout period illustrated in FIGS. 5, 6, and 7, the voltage at the drain of the readout transistor is raised by 2 volts. It can be observed that as a result, the voltage at the gate of the readout transistor has increased in each of the three examples. In FIG. 5, a comparison of the gate voltage at the end of the integration period with the gate voltage during the readout period reveals that the voltage at the gate has gone from about 1.5 volts to about 3.15 volts. In FIG. 6, a comparison of the gate voltage at the end of the integration period with the gate voltage during the readout period reveals that the voltage at the gate has gone from about 0.6 volts to about 0.9 volts. In FIG. 7, a comparison of the gate voltage at the end of the integration period with the gate voltage during the readout period reveals that the voltage at the gate has gone from about 0.2 volts to about 0.6 volts. The increase at the gate in these examples is a result of the bootstrap amplification that takes place due to capacitive coupling between the drain and source and the gate of the readout transistor. This increase is generally an amount that is less than the amount that the source of the readout transistor is increased, unless the gate-drain overlap capacitance is significant.

In the examples shown in FIGS. 5, 6, and 7, the value of kappa, κ, described above is two-thirds, and $V_{TH}$ is 0.6 volts. In accordance with the above discussion, the output source voltage will settle such that two-thirds of the gate-to-source voltage, $V_{GS}$, added to one-third of the bulk-to-source voltage, $V_{BS}$, will be equal to approximately 0.4 volts. In FIGS. 5, 6, and 7, during the readout period, this provides source voltages of 1.7, 0.2, and nearly 0 volts, respectively.

Figure 8:
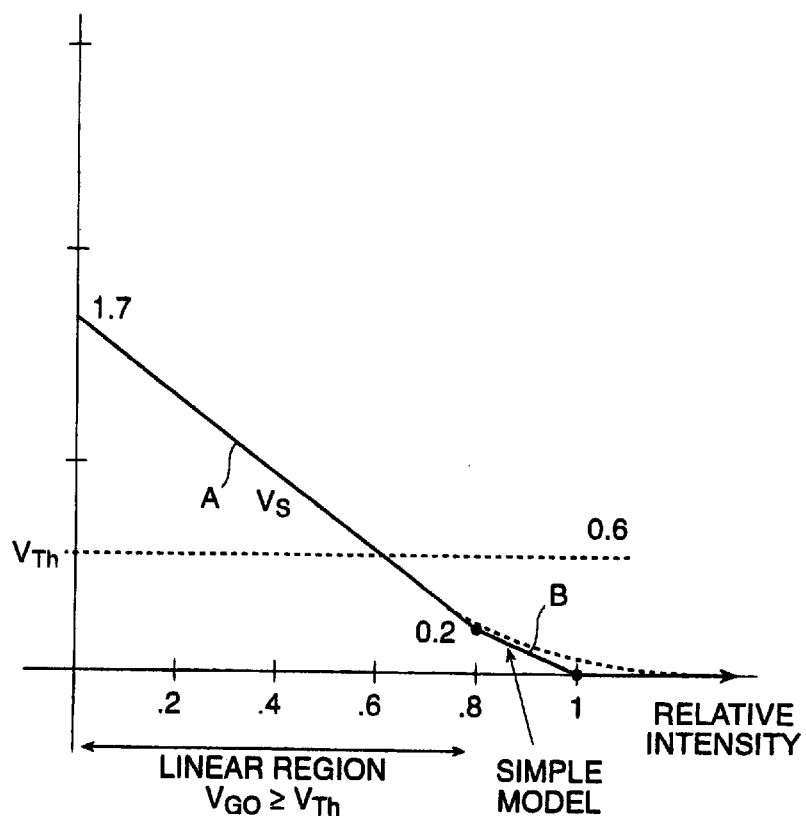
FIG. 8 illustrates compression in the gain of an active pixel sensor as the relative light intensity increases according to the present invention.

In FIG. 8, the voltage depicted for the differing light conditions in FIGS. 5, 6, and 7 for the source during readout is illustrated graphically. From FIG. 8, those of ordinary skill in the art will readily appreciate that according to the present invention, the gain is compressed as the relative intensity in the light increases. This can be observed from the graph of the voltage $V_S$ at the source daring readout by comparing area A in the graph with area B in the graph. Area A of the graph of Vs has a first slope, and area B of the graph of Vs has a second slope such that the slope of area B has an absolute value that is less than the absolute value of the slope in area A. This change in the slope of the graph of Vs as the relative light intensity increases corresponds to a compression in the gain. The dashed line indicates that the gain becomes even more compressive than is demonstrated by slope of area B. This further compression is due to sub-threshold effects, the discussion of which is beyond the scope of this disclosure.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An active pixel sensor comprising:

a photosensor having a first terminal and a second terminal, said first terminal coupled to a first reference potential;

a reset transistor having a gate, a source and a drain, said gate coupled to a reset line, said drain coupled to a second reference potential, and said source coupled to said second terminal of said photosensor; and a readout transistor having a gate, a source, and a drain, said gate coupled to said second terminal of said photosensor, and said drain coupled to a switchable voltage source, said switchable voltage source configured to apply a first voltage level to said readout transistor during charge integration, and a second voltage level during readout.

2. An active pixel sensor as in claim 1, wherein said gate of said readout transistor is coupled to said second terminal of said photodiode by a transfer transistor having a first source/drain coupled to said second terminal of said photosensor, a second source/drain coupled to said gate of said readout transistor, and a gate coupled to a transfer line.

3. A method of operating an active pixel sensor having a photosensor, a reset transistor, a readout transistor, and a row select transistor, said readout transistor having a gate coupled to said photosensor, a drain coupled to a switchable supply voltage, and a source, and said row select transistor having a gate coupled to a row select line, a drain coupled to said source of said readout transistor, and a source, comprising the steps of:

applying a reset signal at a first logic level to said gate of said reset transistor during a reset period to set said photosensor at a reset potential;

applying a reset signal at a second logic level to said gate of said reset transistor during an integration period to begin capture of photocharge;

applying a first supply voltage to said drain of said readout transistor during said integration period to bias said readout transistor to have a first gate capacitance;

applying a row select signal at said gate of said row select transistor during a readout period to output a signal corresponding to said photocharge; and applying a second supply voltage to said drain of said readout transistor during said readout period to bias said readout transistor to have a second gate capacitance less than said first gate capacitance, said second supply voltage being different from said first supply voltage and operable to provide a compression gain.

4. The method of operating an active pixel sensor as in claim 3, wherein said second supply voltage is applied approximately in synchronism with said row select signal.

5. A method of operating an active pixel sensor having a photosensor, a reset transistor, a transfer transistor, a readout transistor, and a row select transistor, said transfer transistor having a first source/drain coupled to said photosensor, a gate coupled to a transfer line, and a second source/drain, said readout transistor having a gate coupled to said second source/drain of said transfer transistor, a drain coupled to a switchable supply voltage, and a source, and said row select transistor having a gate coupled to a row select line, a drain coupled to said source of said readout transistor, and a source, comprising the steps of:

applying a reset signal at first logic level to said gate of said reset transistor during a reset period to set said photosensor to a reset potential;

applying a transfer signal at a first logic level to said gate of said transfer transistor to transfer charge between said photosensor and said gate of said readout transistor;

applying a reset signal at a second logic level to said gate of said reset transistor during an integration period to begin capture of photocharge;

applying a transfer signal at a second logic level to said gate of said transfer transistor to end capture of photocharge;

applying a first supply voltage to said drain of said readout transistor during said integration period to bias said readout transistor to have a first gate capacitance;

applying a row select signal at said gain of said row select transistor during a readout period to output a signal corresponding to said photocharge; and applying a second supply voltage to said drain of said readout transistor during said readout period to bias said readout transistor to have a second gate capacitance less than said first gate capacitance, said second supply voltage different from said first supply voltage and operable to provide a compression gain.

6. The method of operating an active pixel sensor as in claim 5, wherein said second supply voltage is applied approximately in synchronism with said row select signal.

* * * * *